United States Patent [19]

Malka et al.

[11] Patent Number: 4,677,581

[45] Date of Patent: Jun. 30, 1987

[54] MULTICHANNEL, SELF-CALIBRATING, ANALOG INPUT/OUTPUT APPARATUS FOR GENERATING AND MEASURING DC STIMULI

[75] Inventors: Jacob H. Malka, Fair Lawn; Philip J. Thurakal, New Milford, both of N.J.

[73] Assignee: Allied Corporation, Morris Township, Morris County, N.J.

[21] Appl. No.: 739,263

[22] Filed: May 30, 1985

[51] Int. Cl.$^4$ ............................................. H03K 13/02
[52] U.S. Cl. ........................... 364/571; 340/347 CC; 340/347 DA; 364/580
[58] Field of Search ..................... 364/571, 483, 580; 340/347 CC, 347 DA; 324/130

[56] References Cited

U.S. PATENT DOCUMENTS

| | | | |
|---|---|---|---|
| 4,375,072 | 2/1983 | Rice | 324/130 X |
| 4,399,426 | 8/1983 | Tan | 364/571 X |
| 4,551,709 | 11/1985 | Merchant et al. | 340/347 CC X |
| 4,587,477 | 5/1986 | Hornak et al. | 340/347 CC X |
| 4,607,248 | 8/1986 | Botka et al. | 340/347 CC X |

Primary Examiner—Gary Chin
Assistant Examiner—H. R. Herndon
Attorney, Agent, or Firm—Howard G. Massung; Stanley N. Protigal

[57] ABSTRACT

Analog input/output apparatus includes a plurality of digital to analog converters (18, 20, 22, 24, 26) and a plurality of interfacing means (4, 6, 8, 10, 12, 14, 16) for interfacing the converters with a central processing unit (2). A plurality of current and voltage sources (28, 30, 32, 34, 36, 38, 40, 42) are connected to the converters for providing a plurality of voltage and current stimuli signals and monitor signals. A signal measurement channel (44, 46, 48, 52) is responsive to the monitor signals and is controlled by the interfacing means (4–16), and multiplexers (44, 46) are wrapped around the measurement channel to provide a self-calibration channel (50). The central processing unit is responsive to the self-calibration channel output for determining the correction to be applied to the stimuli signals.

9 Claims, 3 Drawing Figures

MULTICHANNEL, SELF-CALIBRATING, ANALOG INPUT/OUTPUT APPARATUS FOR GENERATING AND MEASURING DC STIMULI

BACKGROUND OF THE INVENTION

Automatic test equipment such as used, for example, in testing aircraft engine and/or flight parameters uses DC stimuli signals which must be generated with a high degree of accuracy. Accordingly, apparatus for generating said stimuli signals should include signal measurement and self-calibration features.

Prior to the present invention, calibration means for apparatus of the type described required precision analog to digital converters for these purposes and a correction was applied by measuring a reference voltage error and offset. This arrangement has, among others, the disadvantage of not correcting for output non-linearity. The present invention overcomes the disadvantages of the prior art by amplifying existing errors and measuring the errors using conventional analog to digital converters. The measured errors are reduced via a least square error reduction arrangement, based on a minimum number of error measurements to accomplish the required calibration. A central processing unit (CPU) determines the offset and gain correction to be applied.

SUMMARY OF THE INVENTION

This invention contemplates apparatus including a plurality of channels for precisely generating and measuring DC current and voltage stimuli signals and includes a calibration arrangement based on least square error reduction principles.

The generated signals are measured either single ended or differentially with a high degree of accuracy. The plurality of signal generating channels are dual range; have high and low power capabilities; are bidirectional; and are ground referenced. The signal generating channels are wrapped around a measurement channel to impart a built-in test capability to the apparatus. The accuracy of the signal generating channels is enchanced by a high gain measurement arrangement whereby signal errors are amplified for calibration via a central processing unit.

DETAILED DESCRIPTION OF THE INVENTION

Figure 1:
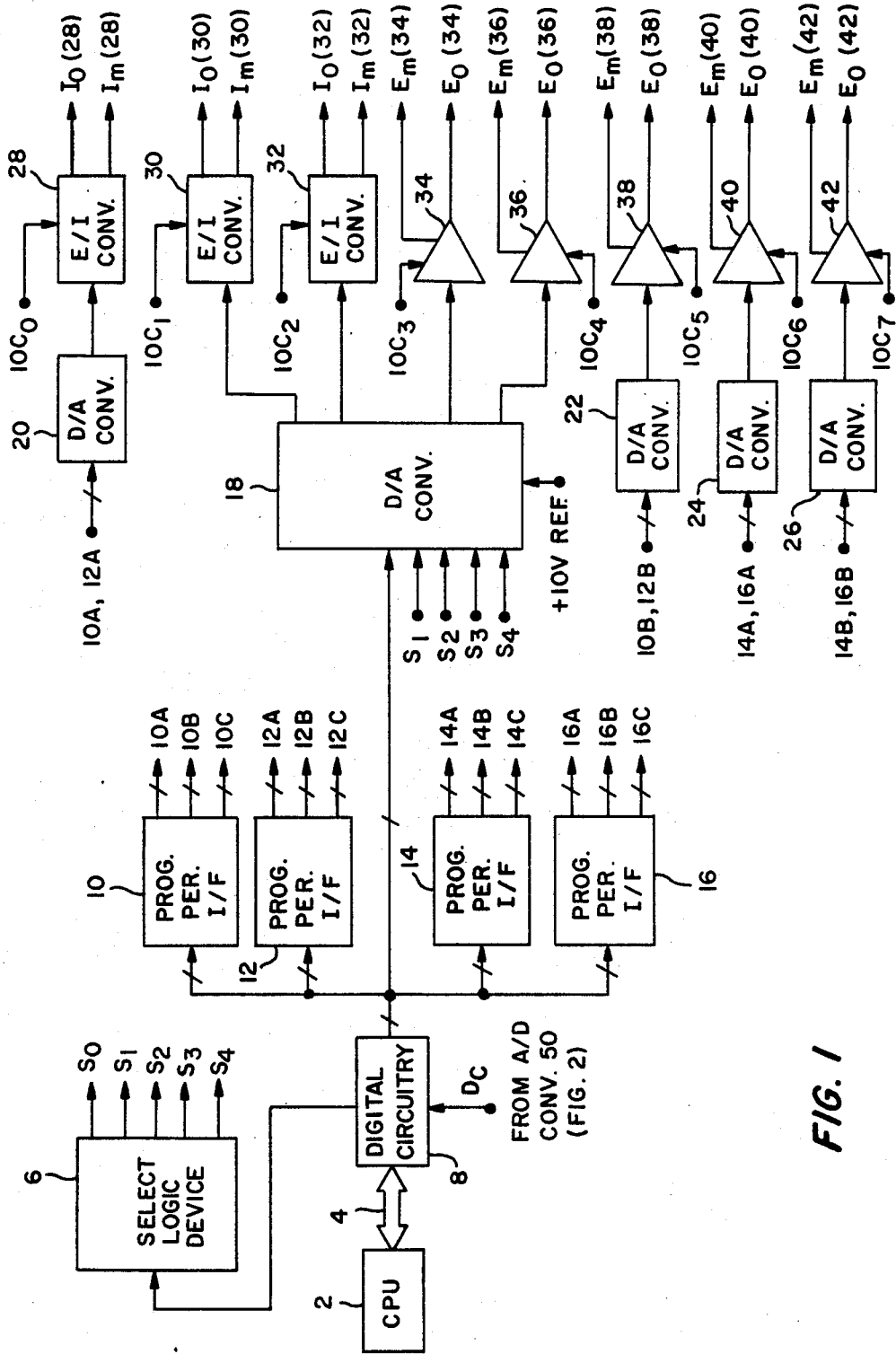
FIG. 1 is a block diagram illustrating the analog output function of the invention

With reference to FIG. 1, a central processing unit (CPU) 2 is connected via an input/output bus 4 to digital circuitry 8. Digital circuitry 8 provides a controlling output for controlling a select logic device 6, which provides logic outputs $S_0$, $S_1$, $S_2$, $S_3$ and $S_4$.

Digital circuitry 8 provides a sixteen bit controlling output, eight bits of which control programmable peripheral input/output interfaces 10, 12, 14, and 16. Interface 10 provides eight bit outputs 10A, 10B, and 10C; interface 12 provides eight bit outputs 12A, 12B and 12C; interface 14 provides eight bit outputs 14A, 14B and 14C; and interface 16 provides eight bit outputs 16A, 16B and 16C.

A digital to analog converter 18 is connected to a positive (+) 10 volt reference source and receives logic signals $S_1$, $S_2$, $S_3$ and $S_4$ from select logic device 6. The logic signals are at a logic "low" level so as to enable digital to analog converter 18. Digital to analog converter 18 is controlled by twelve bits of the sixteen bit output from digital circuitry 8.

A digital to analog converter 20 receives signals 10A and 12A (sixteen bits) from the respective interfaces 10 and 12; a digital to analog converter 22 receives signals 10B and 12B (sixteen bits) from the respective interfaces 10 and 12; a digital to analog converter 24 receives signals 14A and 16A (sixteen bits) from the respective interfaces 14 and 16; and a digital to analog converter 26 receives signals 14B and 16B (sixteen bits) from the respective interfaces 14 and 16.

Digital to analog converter 20 is connected to a voltage to current converter 28, and digital to analog converter 18 is connected to a voltage to current converter 30 and is connected to a voltage to current converter 32. Digital to analog converter 18 is further connected to a power amplifier 34 and to a power amplifier 36. Digital to analog converter 22 is connected to a power amplifier 38; digital to analog converter 24 is connected to a power amplifier 40; and digital to analog converter 26 is connected to a power amplifier 42. In this connection it will be understood that voltage to current converter or current source 28 is a sixteen bit device; voltage to current converters or current sources 30 and 32 are twelve bit devices; and amplifiers or voltage sources 34 and 36 are twelve bit devices; and amplifiers or voltage sources 38, 40 and 42 are sixteen bit devices.

Current sources 28, 30 and 32 and voltage sources 34, 36, 38, 40 and 42 receive inputs from programmable peripheral interface 10 and digital circuitry 8. As heretofore noted, each of the signals 10A, 10B and 10C provided by interface 10 is an eight bit signal. Each of the current and voltage sources receives one of the eight bits of signal 10C provided by interface 10. Thus, current sources 28, 30 and 32 receive bits $10C_0$, $10C_1$, and $10C_2$, respectively, and voltage sources 34, 36, 38, 40 and 42 receive bits $10C_3$, $10C_4$, $10C_5$, $10C_6$ and $10C_7$, respectively.

It should be noted that current sources 28, 30 and 32 are devices of the type having (+) or (−) 25 volts compliance and are dual range; i.e., ±50 milliamperes and ±2 milliamperes. The current sources can drive ground reference loads and open circuit compliance is clamped to 30.5 volts maximum. Voltage sources 34, 36, 38, 40 and 42 are dual range; i.e., ±30 volts and ±10 volts, at a 50 milliampere output range.

It will now be understood with reference to FIG. 1 that current sources 28, 30, and 32 and voltage sources 34, 36, 38, 40 and 42 are interfaced to the digital world through digital to analog converters 18, 20, 22, 24, and 26. Interfacing to bus 4 is achieved through programmable peripheral interfaces 10, 12, 14, and 16, select logic device 6 and digital circuitry 8.

In accordance with the above, current sources 28, 30 and 32 provide DC current stimuli signals $I_0(28)$, $I_0(30)$ and $I_0(32)$, respectively, and provide DC current monitor signals $I_m(28)$, $I_m(30)$ and $I_m(32)$, respectively. Voltage sources 34, 36, 38, 40 and 42 provide DC voltage stimuli signals $E_0(34)$, $E_0(36)$, $E_0(38)$, $E_0(40)$ and $E_0(42)$, respectively, and provide DC voltage monitor signals $E_M(34)$, $E_M(36)$, $E_M(38)$, $E_M(40)$, $E_M(42)$, respectively.

Figure 2:
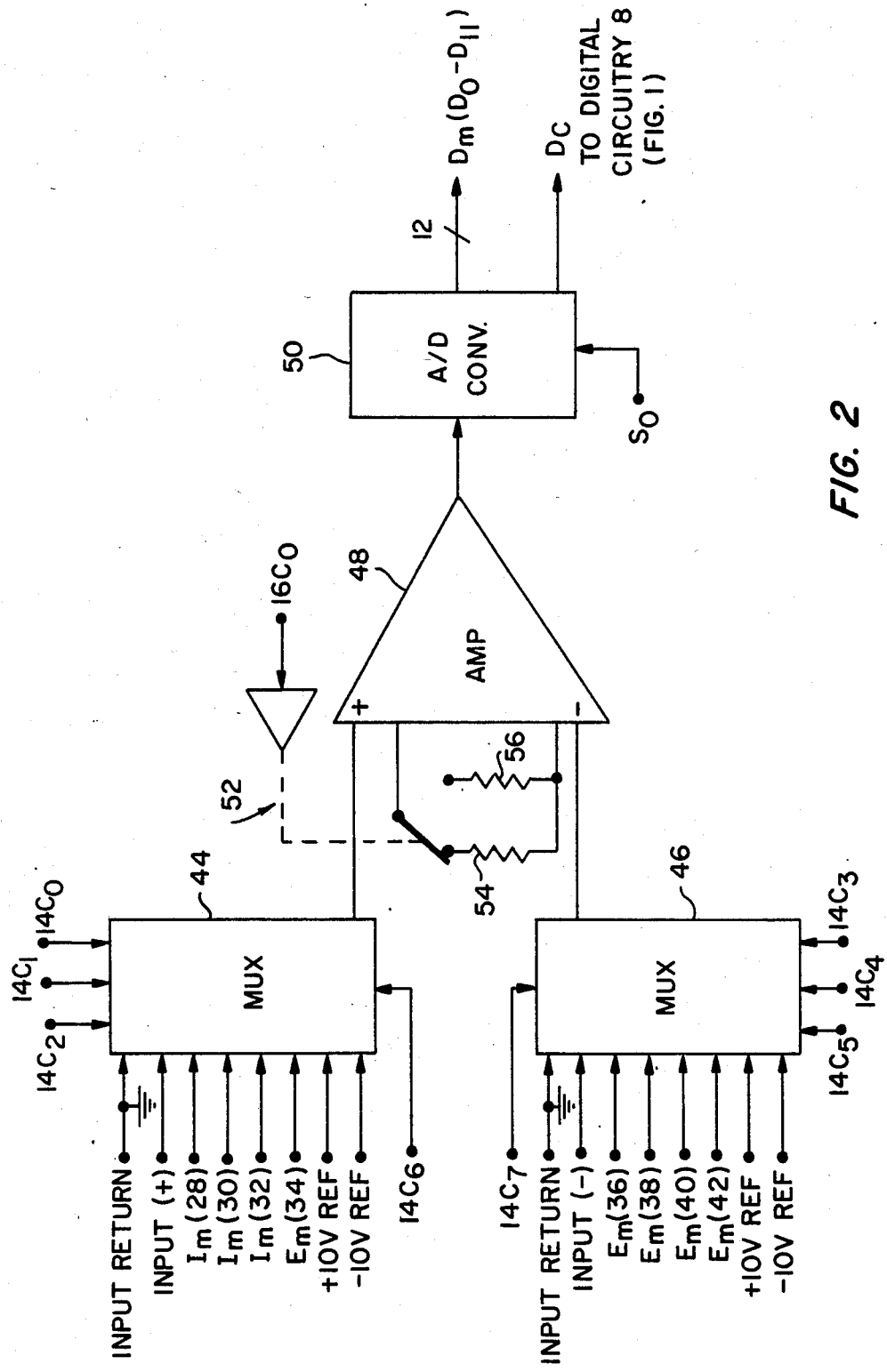
FIG. 2 is a block diagram illustrating the analog input function of the invention

With reference to FIG. 2, a twelve bit signal measurement channel with a gain of 1 and 500 includes multiplexers 44 and 46, an amplifier 48 and an analog to digital converter 50. Self-test channels are wrapped around the measurement channel, using multiplexers 44 and 46 as will be hereinafter explained.

Thus, multplexer 44 is connected to programmable peripheral interface 14 and receives four of the bits of eight bit output 14C therefrom. Multiplexer 14 receives output bits $14C_0$, $14C_1$, $14C_2$ and $14C_6$. Multiplexer 44 is connected to a positive (+) 10 volt reference source and to a negative (−) 10 volt reference source; and is connected to a pair of external measurement inputs, namely input (+) and input return (−), as indicated in the Figure. Multiplexer 44 receives monitor signals $I_m(28)$, $I_m(30)$, $I_m(32)$ and $E_m(34)$.

Multiplexer 46 is connected to programmable peripheral interface 14 and receives the remaining four bits of signal 14C therefrom. Multiplexer 46 receives bits $14C_3$, $14C_4$, $14C_5$ and $14C_7$. Multiplexer 46 is connected to a positive (+) 10 volt reference source and to a negative 10 (−) volt reference source; and is connected to a pair of external measurement negative inputs, namely input (−) and input return (+), as indicated in the Figure. Multiplexer 48 receives monitor signals $E_m(36)$, $E_m(38)$ $E_m(40)$ and $E_m(42)$.

Multiplexer 44 is connected to the non-inverting input terminal (+) of amplifier 48 and multiplexer 46 is connected to the inverting input terminal (−) of the amplifier. Amplifier 48 is connected to analog to digital converter 50 which receives signal $S_0$ at a logic "high" level from select logic device 6.

An analog relay designated generally by the numeral 52 is responsive to bit $16C_0$ of output signal 16C from programmable peripheral interface 16 so as to selectively switch a pair of gain selection resistors 54 and 56, into the amplifier input to provide the aforenoted gain of 1 and 500, respectively, as the case may be.

Thus, single ended or differential measurements with a gain of 1 and 500 are made through amplifier 48 and multiplexers 44 and 46. The gain of 500 is used to amplify errors for calibration purposes.

All voltage and current stimuli signals are thus monitored through multiplexers 44 and 46. Programmable peripheral interface 14 controls the operation and range selection of voltage to current converters 28, 30 and 32 and power amplifiers 34, 36, 38, 40 and 42. All outputs are wrapped around the measurement channel through multiplexers 44 and 46 to provide a built-in test capability. Converter 50 provides a twelve bit measurement signal $D_m$ having bits $D_0$ and $D_{11}$ and provides a signal $D_c$ which is applied to digital circuitry 8 (FIG. 1) and therefrom to CPU 2 via bus 4 which calculates an appropriate correction.

As further illustrated in FIG. 2, error measurements are made at positive full scale (+10) negative full scale (−10) and zero output voltages by the twelve bit measurement channel after error amplification by a factor of 500. Based on these measurements CPU 2 (FIG. 1) calculates two constants, $K_g$ and $K_o$, where $K_g$ is a gain constant and $K_o$ is an offset constant. The correction to be applied is given by the following equation:

$$\delta_\eta = K_o + K_g x.$$

Figure 3:
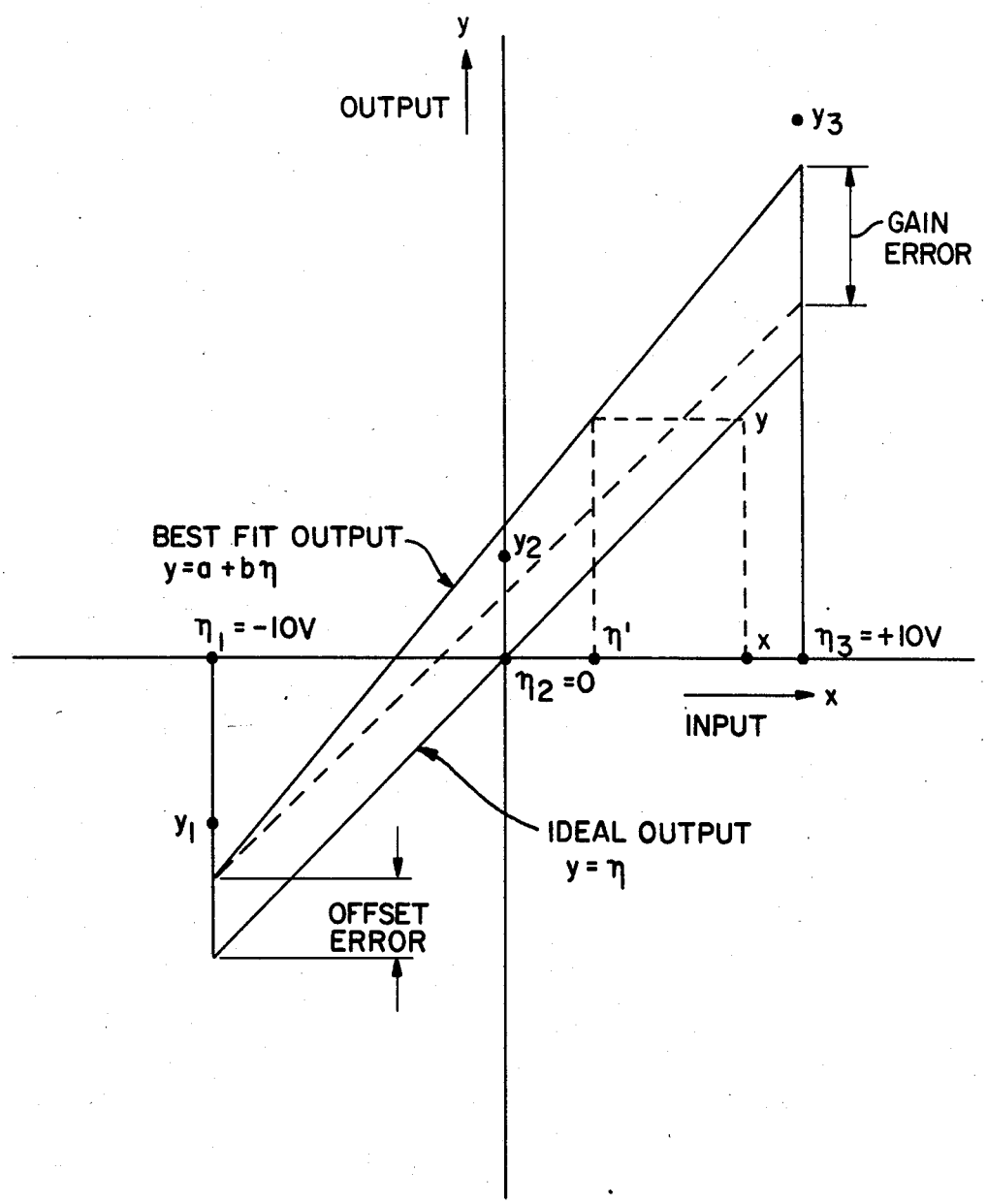
FIG 3 is a graphical respresentation illustrating the least square error reduction feature of the invention.

With reference to FIG. 3, input/output combinations at which error measurements are made are tabulated as follows:

| $\eta$ | −10 V | 0 V | +10 V. |
|---|---|---|---|
| y | $y_1$ | $y_2$ | $y_3$ |

The least square error (best fit output) line is given as:

$$y = a + b(\eta - \overline{\eta}),$$

and, since $\overline{\eta} = 0$, $$y = a + b\eta.$$

where:

$$a = \overline{y} = (y_1 + y_2 + y_3)/3; \tag{1}$$

and:

$$\tag{1}$$

$$b = \Sigma\,(\eta - \overline{\eta})y / \Sigma\,(\eta - \overline{\eta})^2 = \Sigma\,xy / \Sigma\,\eta^2, \text{ since } \overline{\eta} = 0$$

$$\tag{2}$$

$$[-10y_1 + 10y_3]/[(-10)^2 + (10)^2] = (y_3 - y_1)/2 \cdot 1/10.$$

Let x' be the correction for x as shown in FIG. 3. Note that the (−y) values are the same for both the best fit output line and the ideal output line, i.e., y = η and y = a + bη. Hence:

$$a + b\eta' = x;$$

and $$x' = (\eta - a)1/b,$$

where a and b are given by equations (1) and (2).

Let error measurements be $y_1'$, $y_2'$ and $y_3'$, corresponding to output $y_1$, $y_2$, and $y_3$. Since the error measurements are made with respect to −10 volts, zero volts and +10 volts for $y_1'$, $y_2'$, and $y_3'$, respectively, and since the error measurements are amplified by gain G of amplifier 48 (FIG. 2):

$$y_1' = (y_1 + 10)G;\ y_1 = y_1'/G - 10, \tag{3}$$

$$y_2' = y_2 G;\ y_2 = y_2'/G;\text{ and} \tag{4}$$

$$y_3' = (y_3 - 10)G;\ y_3 = y_3'/G + 10. \tag{5}$$

Substituting for a and b, using equations (1), (2), (3), (4) and (5) gives the correction to be subtracted from each input code:

$$(x - \eta') = \delta_\eta \cong (y_1' + y_2' + y_3')/3G +$$

$$[(y_3' - y_1')/20G](x) = K_o + K_g \eta, \text{ where}$$

$$K_o = (y_1' + y_2' + y_3')/3G;\text{ and}$$

$$K_g = (y_3' - y_1')/20G.$$

With the aforegoing description of the invention in mind, reference is made to the claims appended hereto for a definition of the scope of the invention.

What is claimed is:

1. Analog input/output apparatus for generating and measuring analog current and voltage signals, including self-calibrating means, comprising:

processor means for providing digital signals;
digital to analog converter means;
interface means connected to the processor means and responsive to the digital signals for providing interfacing signals, said interface means including digital circuitry means connected to the processor means and responsive to the digital signals therefrom for providing a digital interfacing signal, select logic means connected to the digital circuitry means and controlled thereby for providing a plurality of digital logic interfacing signals, and a plurality of programmable peripheral interface means, each of which is connected to the digital circuitry means and responsive to the digital interfacing signal therefrom for providing a plurality of digital interfacing signals;
the digital to analog converter means connectd to the interfacing means and responsive to certain of the signals therefrom for providing analog signals;
current source means connected to the digital to analog converter means and to the interface means and responsive to first certain of the analog signals and other certain of the signals from the interface means for providing the analog current signals and corresponding analog monitor signals;
voltage source means connected to the digital to analog converter means and to the interface means and responsive to second certain of the analog signals and still other certain of the signals from the interface means for providing the analog voltage signals and corresponding analog monitor signals;
measurement means connected to the current source means, the voltage source means and the interface means, and responsive to the current monitor signals, the voltage monitor signals and yet other certain signals from the interface means for measuring the analog current and voltage signals and providing a self-calibrating output; and
the processor means connected to the measurement means and responsive to the self-calibrating output for determining a correction to be applied to the analog current and voltage signals.

2. Apparatus as described by claim 1, wherein the digital to analog converter means connected to the interfacing means and responsive to certain of the signals therefrom for providing analog signals includes:
a first digital to analog converter connected to the digital circuitry means and to the select logic means, and responsive to the digital interfacing signal and to first certain of the plurality of digital logic interfacing signals therefrom for providing a plurality of analog signals;
a second digital to analog converter connectd to first and second of the plurality of programmable peripheral interface means and responsive to first certain of the plurality of interfacing signals therefrom for providing an anlog signal;
a third digital to analog converter connected to the first and second of the plurality of programmable peripheral interface means and responsive to second certain of the plurality of interfacing signals therefrom for providing an analog signal;
a fourth digital to analog converter connected to third and fourth of the plurality of peripheral interface means and responsive to first certain of the plurality of interfacing signals therefrom for providing an analog signal; and
a fifth digital to analog converter connected to the third and fourth of the plurality of peripheral interface means and responsive to second certain of the plurality of interfacing signals therefrom for providing an analog signal.

3. Apparatus as described by claim 2, wherein the current source means connected to the digital to analog converter means and to the interface means and responsive to first certain of the analog signals and other certain of the signals from the interface means for providing the analog current signals and corresponding analog monitor signals includes:
the first of the plurality of programmable peripheral interface means providing a plurality of signals each of which has a plurality of bits;
a first current source connected to the second digital to analog converter and responsive to the analog signal therefrom, and connected to the first of the plurality of programmable peripheral interface means and responsive to a first of the plurality of bits of one of the plurality of signals therefrom for providing an analog current signal and a corresponding analog monitor signal; and
second and third current sources connected to the first digital to analog converter and responsive to first and second of the plurality of analog signals therefrom, respectively, and connected to the first of the plurality of programmable interface means and responsive to second and third of the plurality of bits of the one of the plurality of signals therefrom, respectively, for providing analog current signals and corresponding analog monitor signals.

4. Apparatus as described by claim 3, wherein the voltage source means connected to the digital to analog converter means and to the interface means and responsive to second certain of the analog signals and still other certain of the signals from the interface means for providing the analog voltage signals and corresponding analog monitor signals includes:
first and second voltage sources connected to the first digital to analog converter and responsive to third and fourth of the plurality of analog signals therefrom, respectively, and connected to the first of the plurality of programmable interface means and responsive to fourth and fifth of the plurality of bits of the one of the plurality of signals therefrom, respectively, for providing analog voltage signals and corresponding analog monitor signals; and
third, fourth and fifth voltage sources connected to the third, fourth and fifth digital to analog converters, respectively, and responsive to the analog signals therefrom, and connected to the first of the programmable peripheral interface means and responsive to sixth, seventh and eighth of the plurality of bits of the one of the plurality of signals therefrom, respectively, for providing analog voltage signals and corresponding analog monitor signals.

5. Apparatus as described by claim 4 wherein the measurement means connected to the current source means, the voltage source means and the interface means, and responsive to the current monitor signals, the voltage monitor signals and yet other certain signals from the interface means for measuring the analog current and voltage signals and for providing a self-calibrating output includes:

the third of the the plurality of programmable peripheral interface means providing a plurality of signals each of which has a plurality of bits;

first multiplexer means connected to the first, second and third current source means and to the first voltage sources means and responsive to the analog monitor signals therefrom, and connected to the third of the plurality of programmable peripheral interface means and responsive to first certain of the plurality of bits of one of the plurality of signals therefrom for providing a first multiplexed output;

second multiplexer means connected to the second, third, fourth and fifth voltage source means and responsive to the analog monitor signals therefrom, and connected to the third of the plurality of programmable peripheral interface means and responsive to second certain of the plurality of bits of the one of the plurality signals therefrom for providing a second multiplexed signal;

gain adjustment means connected to the first and second multiplexer means for adjusting the gain of the signal therefrom and for providing an analog gain adjusted signal; and an analog to digital converter connected to the gain adjustment means and connected to the select logic means and responsive to a certain of the plurality of logic interfacing signals therefrom for providing a digital signal having a plurality of bits and commensurate with the measurement of the analog current and voltage signals, and for providing a digital self-calibrating signal.

6. Apparatus as described by claim 5, including:

means connected to the gain adjustment means and to the fourth of the plurality of programmable peripheral interface means and responsive to a certain of the plurality of interfacing signals therefrom for adjusting the gain of the gain adjustment means.

7. Apparatus as described by claim 6, wherein:

the fourth of the plurality of programmable peripheral interface means provides a plurality of signals, each of which has a plurality of bits; and the means for adjusting the gain of the gain adjustment means includes at least first and second resistor means, and switching means responsive to a certain of the plurality of bits of one of the plurality of signals from the fourth programmable peripheral interface means for selectively connecting one of the first and second resistor means to the gain adjustment means.

8. Apparatus as described by claim 5, including:

the digital self-calibrating signal being applied to the digital circuitry means and therefrom through an input/output bus to the processor means;

and the processor means being responsive to the self-calibrating signal for determining a correction to be applied to the analog current and voltage signals through the input/output bus and the digital circuitry means.

9. Apparatus as described by claim 8, further including:

the correction determined by the processor means being commensurate with reducing analog voltage and current errors via a least square error reduction based on a minimum number or error measurements, and whereby the processor means determines a gain correction constant and an offset correction constant.

* * * * *